US010297524B2

(12) United States Patent
Watanabe et al.

(10) Patent No.: US 10,297,524 B2
(45) Date of Patent: May 21, 2019

(54) HEAT SINK

(71) Applicant: APS Japan Co., Ltd., Osaka-shi (JP)

(72) Inventors: Hidemitsu Watanabe, Osaka (JP); Hiroyuki Watanabe, Osaka (JP); Takafumi Watanabe, Osaka (JP)

(73) Assignee: APS JAPAN CO., LTD., Osaka-shi (JP)

(*) Notice: Subject to any disclaimer, the term of this patent is extended or adjusted under 35 U.S.C. 154(b) by 282 days.

(21) Appl. No.: 15/139,539

(22) Filed: Apr. 27, 2016

(65) Prior Publication Data

US 2016/0341492 A1 Nov. 24, 2016

(30) Foreign Application Priority Data

May 19, 2015 (JP) ................................. 2015-101865

(51) Int. Cl.
*H01L 21/48* (2006.01)
*H01L 23/367* (2006.01)

(52) U.S. Cl.
CPC ...... *H01L 23/3677* (2013.01); *H01L 21/4882* (2013.01); *F28F 2215/04* (2013.01); *F28F 2215/06* (2013.01); *F28F 2215/10* (2013.01)

(58) Field of Classification Search
CPC .............. H01L 23/3677; H01L 23/3672; F28F 2215/06; F28F 2215/10; F28F 2215/04
USPC .......................... 165/80.3, 179, 181; 361/693
See application file for complete search history.

(56) References Cited

U.S. PATENT DOCUMENTS

| 4,204,312 | A | * | 5/1980 | Tooker | ................... | B21D 39/06 |
| | | | | | | 29/243.517 |
| 4,620,216 | A | * | 10/1986 | Horvath | ................ | H01L 23/367 |
| | | | | | | 257/713 |
| D304,715 | S | * | 11/1989 | Horvath | ........................ | D13/179 |
| 5,351,748 | A | * | 10/1994 | Dagan | ..................... | F28F 3/022 |
| | | | | | | 165/185 |
| 5,369,301 | A | * | 11/1994 | Hayashi | .............. | H01L 21/4882 |
| | | | | | | 165/80.3 |
| 5,781,411 | A | * | 7/1998 | Feenstra | ............. | H01L 23/3677 |
| | | | | | | 165/80.3 |

(Continued)

FOREIGN PATENT DOCUMENTS

JP 2013-175450 A1 9/2013
JP 2014-78563 A1 5/2014

*Primary Examiner* — Devon Russell
(74) *Attorney, Agent, or Firm* — Kratz, Quintos & Hanson, LLP (57) ABSTRACT

To provide a heat sink capable of enhancing heat dissipation performance.
Cylindrical bodies 3 have openings 3a of which inner and outer sides are opened on front ends and are provided with through-holes 3b communicating the inner side and the outer side on side walls at the base end side. The cylindrical bodies 3 are provided in a standing manner in a state where portions at the base end side penetrate through a supporting main body 2 and project into a gap s1, the through-holes 3b are opened to the gap s1, and portions at the front end side also project from the surface of the supporting main body 2 at the opposite side to the gap s1. An atmosphere in the gap s1, which contains heat from a cooling target object 9, is capable of being made to flow into the cylindrical bodies 3 through the through-holes 3, circulate in inner spaces of the cylindrical bodies 3, and be released to the outside through the openings 3a on the front ends.

6 Claims, 10 Drawing Sheets

(56) References Cited

U.S. PATENT DOCUMENTS

| | | | | |
|---|---|---|---|---|
| 5,894,882 A * | 4/1999 | Kikuchi | F28F 3/027 | 165/185 |
| 6,021,045 A * | 2/2000 | Johnson | H01L 23/3677 | 165/185 |
| 6,085,830 A * | 7/2000 | Mashiko | B22D 17/24 | 165/185 |
| 6,134,783 A * | 10/2000 | Bargman | B21C 23/20 | 165/185 |
| 6,357,514 B1 * | 3/2002 | Sasaki | H01L 23/3672 | 165/185 |
| 6,374,490 B1 * | 4/2002 | Miyahara | B21D 22/04 | 29/557 |
| 6,374,905 B1 * | 4/2002 | Tantoush | H01L 23/367 | 165/104.33 |
| 6,424,530 B1 * | 7/2002 | Lee | H01L 23/4093 | 165/185 |
| 6,741,470 B2 * | 5/2004 | Isenburg | H01L 23/4093 | 165/80.3 |
| 6,754,078 B1 * | 6/2004 | Chen | H01L 23/3672 | 165/185 |
| 6,926,071 B2 * | 8/2005 | Lee | B21D 53/02 | 165/80.3 |
| 6,940,718 B2 * | 9/2005 | Gedamu | H01L 23/3677 | 165/104.33 |
| 7,182,124 B2 * | 2/2007 | Chen | H01L 23/467 | 165/185 |
| 7,357,173 B2 * | 4/2008 | Griesmayer | H01L 23/3677 | 165/80.3 |
| 8,018,720 B2 * | 9/2011 | Campbell | F28D 15/0266 | 165/104.33 |
| 8,296,947 B2 * | 10/2012 | Liu | B21D 53/085 | 165/185 |
| 9,120,139 B2 * | 9/2015 | Yamanoi | B21J 5/063 | |
| 2003/0221814 A1 * | 12/2003 | Kamath | F28F 3/022 | 165/80.3 |
| 2009/0014154 A1 * | 1/2009 | Schick | F21V 29/004 | 165/80.3 |
| 2010/0193175 A1 * | 8/2010 | Gilliland | F28F 1/08 | 165/287 |
| 2012/0186798 A1 * | 7/2012 | Meyer, IV | F28F 1/14 | 165/181 |
| 2016/0300785 A1 * | 10/2016 | Kimura | H01L 23/29 | |

\* cited by examiner

HEAT SINK

TECHNICAL FIELD

The present invention relates to a heat sink that is attached to a cooling target object and dissipates heat which is transferred from the cooling target object into the air.

BACKGROUND ART

As a heat sink of this type, conventionally, a heat sink including a supporting plate that makes close contact with and is fixed to a cooling target object and is made of a material having excellent heat conductivity, and a plurality of plate-like, columnar, or cylindrical fins that are provided on the supporting plate in a standing manner and are made of a material having excellent heat conductivity has been provided (for example, see Patent Documents 1 and 2). The disclosed heat sink is configured to dissipate heat transferred to the supporting plate from the cooling target object into the air through the surfaces of the fins. For example, in recent years, light-emitting diode (LED) lighting has been widely spread and high-output LED lighting such as lighting for a warehouse has been provided. Increase in output increases a heat generation amount and further improvement in heat dissipation performance of the heat sink is therefore required in order to protect LED elements of which lifetime is easy to be shorten with heat.

In order to improve the heat dissipation performance of the heat sink while avoiding increase in size thereof, the number of fins can be increased. The increase in the number of fins increases a heat dissipation area, so that improvement in the heat dissipation performance can be expected. However, the increase in the number of fins lowers strength of the supporting plate supporting the fins and thereby lowers strength for supporting the fins, resulting in a problem. Further, when the fins are crowded, hot air is accumulated between the fins. In particular, the hot air is accumulated near the supporting plate at the base end side and heat absorbing performance from the cooling target object also lowers. This causes certain limitation on the improvement in the heat dissipation performance. An air blower such as a fan can be separately provided so as to forcibly dissipate the hot air between the fins but it is limited. The air blower cannot be provided in some heat sinks because of increase in weight, space, and the like.

CITATION LIST

Patent Literatures

Patent Document 1: JP-A No. 2013-175450
Patent Document 2: JP-A No. 2014-78563

SUMMARY OF INVENTION

Technical Problem

In view of the above-mentioned circumstances, an object of the present invention is to provide a heat sink capable of further enhancing heat dissipation performance.

Solution to Problem

A heat sink according to an aspect of the invention includes a supporting main body that is fixed to a cooling target object in a state where a gap from the cooling target object is ensured and is made of a material having excellent heat conductivity; and one or a plurality of cylindrical body(ies) that is(are) provided on the supporting main body in a standing manner and is(are) made of a material having excellent heat conductivity; wherein the cylindrical body has an opening of which inner and outer sides are opened on a front end and is provided with a through-hole communicating an inner side and an outer side on a side wall at a base end side, the cylindrical body is provided in the standing manner in a state where a portion at the base end side penetrates through the supporting main body and projects into the gap, the through-hole is opened to the gap, and a portion at the front end side also projects from a surface of the supporting main body at an opposite side to the gap, and an atmosphere in the gap, which contains heat from the cooling target object, is capable of being made to flow into the cylindrical body through the through-hole, circulate in an inner space of the cylindrical body; and be released to outside through the opening on the front end.

It is preferable that the base end of the cylindrical body be fixed in a state of abutting against the cooling target object.

A heat sink according to another aspect of the invention includes a supporting main body to which a cooling target object is fixed and that is made of a material having excellent heat conductivity; and one or a plurality of cylindrical body(ies) that is(are) provided on the supporting main body in a standing manner and is(are) made of a material having excellent heat conductivity; wherein the cylindrical body has an opening of which inner and outer sides are opened on a front end and is provided with a through-hole communicating an inner side and an outer side on a side wall at a base end side, the cylindrical body is configured by coupling at least equal to or more than two cylinders including a cylinder at the base end side, which has the through-hole and is fixed to the supporting main body; and a cylinder at the front end side, which has the opening, to each other in an axial direction in a state where inner spaces of the cylinders communicate with each other, and an atmosphere containing heat emitted from the supporting main body is capable of being made to flow into the cylindrical body through the through-hole, circulate in an inner space of the cylindrical body; and be released to outside through the opening on the front end.

It is preferable that an outer diameter of the cylinder at the base end side be set to be smaller than an outer diameter of the cylinder at the front end side and the cylinder at the base end side be made of a material having higher heat conductivity than a material of the cylinder at the front end side.

Further, it is preferable that a plurality of protrusions extending along the axial direction be provided on an outer circumferential surface of the cylinder at the front end side at an interval in a circumferential direction.

Moreover, it is preferable that the cylinders be coupled by fixing end portions of the cylinders to each other by pipe expansions thereof.

Further, it is preferable that the supporting main body be configured by a supporting plate to which the cylindrical body is fixed and caulked by press-working thereof.

In particular, it is preferable that the heat sink be configured by providing an attachment hole through which the cylindrical body is inserted on the supporting plate for fixing, forming a thick portion along an inner circumferential edge of the attachment hole by burring working, performing compression press working on the thick portion from the axial direction in a state where the cylindrical body has been inserted into the attachment hole, and plastically deforming the thick portion in a direction toward a center of the attachment hole and pressure-bonding the thick portion to an outer circumferential surface of the cylindrical body for caulking fixing.

Advantageous Effects of Invention

In the heat sink according to the invention of the present application, which is configured as described above, the cylindrical body has the opening of which inner and outer sides are opened on the front end and is provided with the through-hole communicating the inner side and the outer side on the side wall at the base end side, and the cylindrical body is provided in the standing manner in the state where the portion at the base end side penetrates through the supporting main body and projects into the gap, the through-hole is opened to the gap, and the portion at the front end side also projects from the surface of the supporting main body at the opposite side to the gap. With this configuration, the cylindrical body can be provided in the standing manner relatively freely in comparison with the conventional configuration in which the supporting main body is made close contact with the cooling target object, and the degree of freedom of design is enhanced. In addition, heat of the cooling target object is dissipated to the outside through the supporting main body and the cylindrical body and, in particular, heat in the gap between the supporting main body and the cooling target object can be also taken into the inner space of the cylindrical body through the through-hole so as to flow to the front end side as heat flow, and be efficiently discharged to the outside through the opening on the front end. Also in the process thereof, the heat is discharged to the outside through a circumferential wall of the cylindrical body. Therefore, the heat sink having an excellent heat dissipation effect can be provided without increasing the number of cylindrical bodies.

Further, the base end of the cylindrical body is fixed in the state of abutting against the cooling target object. With this configuration, the cylindrical body is made into a stable posture in which an intermediate portion thereof is fixed to the supporting main body and the base end thereof abuts against the cooling target object. Therefore, strength for supporting the cylindrical body is improved so as to enlarge the range of choices for a material, an outer diameter, a thickness dimension, and the like of the cylindrical body. This enables the degree of freedom of design to be improved.

In addition, the cylindrical body is configured by coupling at least equal to or more than two cylinders including the cylinder at the base end side, which has the through-hole and is fixed to the supporting main body; and the cylinder at the front end side, which has the opening, to each other in the axial direction in the state where the inner spaces of the cylinders communicate with each other, and the atmosphere containing heat emitted from the supporting main body is capable of being made to flow into the cylindrical body through the through-hole, circulate in the inner space of the cylindrical body; and be released to outside through the opening on the front end. With this configuration, the plurality of cylinders configuring the cylindrical body can have configurations in accordance with respective positions while materials and structures of the cylinders are made different. Therefore, a heat sink having excellent heat dissipation performance can be provided at reduced cost without increasing the number of cylindrical bodies.

Further, the outer diameter of the cylinder at the base end side is set to be smaller than the outer diameter of the cylinder at the front end side and the cylinder at the base end side is made of the material having higher heat conductivity than the material of the cylinder at the front end side. With this configuration, the outer diameter of the cylinder at the base end side, which is fixed to the supporting main body, is set to be smaller than the outer diameter of the cylinder at the front end side so as to prevent lowering in the strength of the supporting main body itself for fixing the cylinder at the base end side (note that the strength lowers when the hole for caulking fixing is large). In addition, for coping with a point that the cylinder at the base end side is reduced in thickness in order to maintain the inner space of the cylindrical body, the material having excellent heat conductivity is selected so as to complement a heat absorbing effect for heat from the supporting main body. With this, excellent heat absorbing performance and heat conductivity can be maintained.

In addition, for example, a material having heat conductivity lower than that of the cylinder at the base end side but reduced in cost can be selected for the cylinder at the front end side. With this, the cylinder at the front end side can have a large dimension, thereby ensuring a cross-sectional area thereof. In particular, the cylinder at the base end side, which is made of an expensive material, can be set to have the minimum length having a site at which it is fixed to the supporting main body, a site at which the through-hole is provided, and a site at which the cylinder is coupled thereto and another portion can be configured by the cylinder made of a relatively inexpensive material. This enables reduction in cost while enhancing the heat absorbing performance and the heat conductivity as described above.

Further, the plurality of protrusions extending along the axial direction are provided on the outer circumferential surface of the cylinder at the front end side at an interval in the circumferential direction. Therefore, the surface area is increased and heat dissipation performance is enhanced. This configuration can enhance an effect of dissipating the hot air taken into the inner space to the outside through a pipe wall in a process in which the hot air circulates to the front end side. As a result, the circulation of the hot air in the inner space of the cylindrical body is further accelerated, thereby further enhancing a series of heat dissipation effect including taking of the hot air at the base end side, movement thereof to the front end side, and the release thereof.

Moreover, the cylinders are coupled by fixing the end portions of the cylinders to each other by the pipe expansions thereof. Therefore, coupling strength and heat conductivity between the cylinders can be further enhanced in comparison with coupling with an adhesive or the like, thereby making manufacturing more efficient.

Further, the supporting main body is configured by the supporting plate to which the cylindrical body is fixed and caulked by press-working thereof. Therefore, in the same manner, the coupling strength and the heat conductivity between them can be further enhanced in comparison with coupling with an adhesive or the like, thereby making manufacturing more efficient.

In addition, the heat sink is configured by providing an attachment hole through which the cylindrical body is inserted on the supporting plate for fixing, forming a thick portion along the inner circumferential edge of the attachment hole by burring working, performing compression press working on the thick portion from the axial direction in the state where the cylindrical body has been inserted into the attachment hole, and plastically deforming the thick portion in the direction toward the center of the attachment hole and pressure-bonding the thick portion to the outer circumferential surface of the cylindrical body for caulking fixing. With this configuration, a contact area of the inner surface of the thick portion of the supporting plate with the outer circumferential surface of the cylindrical body is increased so as to improve the supporting strength and transfer the heat absorbed by the supporting plate to the cylindrical body side efficiently. This can further enhance the heat dissipation effect.

DESCRIPTION OF EMBODIMENTS

Next, embodiments of the present invention will be described in detail with reference to the accompanying drawings. In the following respective embodiments, a heat sink according to the invention is applied to the configuration for dissipating heat emitted from an LED substrate of an LED lighting device, as an example. It should be noted that the invention is not limited to the heat sink of the LED lighting device and can be widely applied as heat sinks of various products, such as a power integrated circuit (IC) of a power amplifier or the like, heat sinks of various types of electronic circuits and electronic and electric devices, for example. Specific shapes, dimensions, materials, and the like of the heat sinks can be appropriately selected depending on intended use.

First, a first embodiment of the invention will be described with reference to FIG. 1, FIG. 2, FIG. 3, FIG. 4 and FIG. 5.

Figure 1:
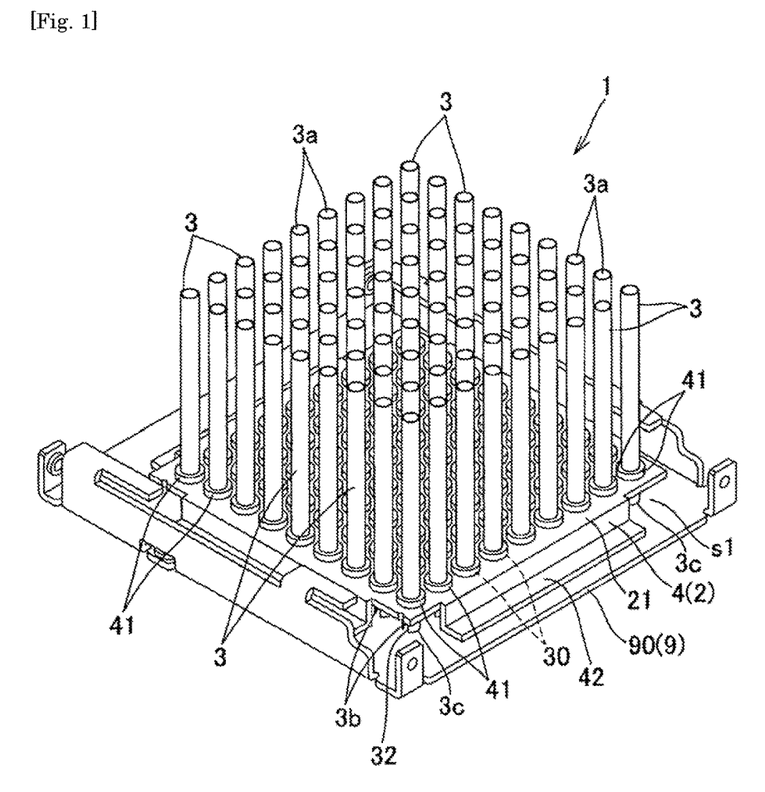
FIG. 1 is a perspective view illustrating a heat sink according to a first embodiment of the invention.
Figure 2:
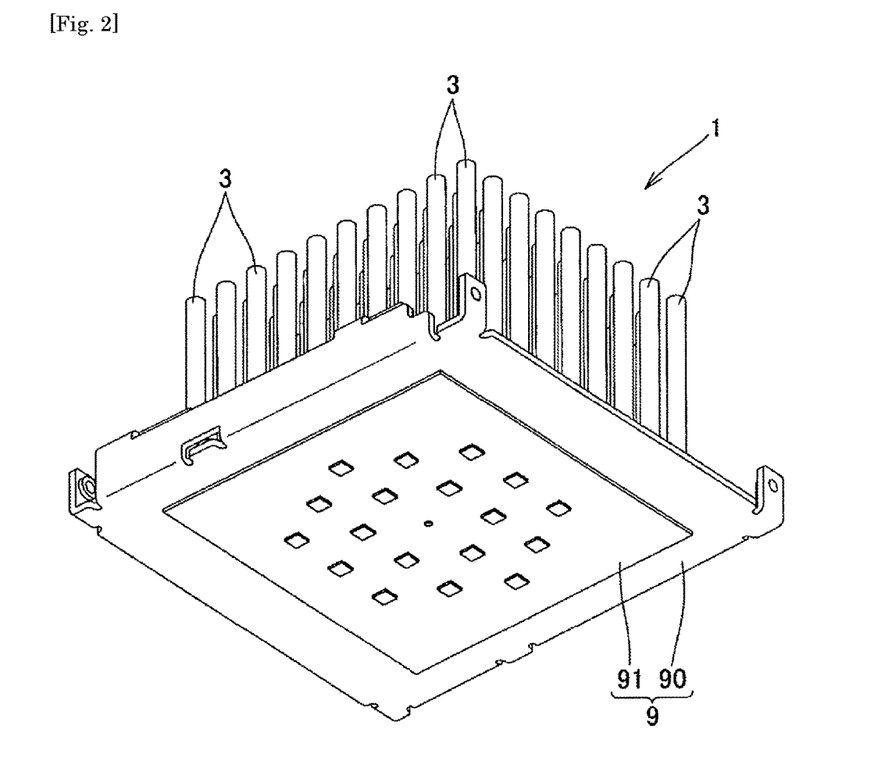
FIG. 2 is a perspective view illustrating the heat sink when seen from a cooling target object side sink.
Figure 3:
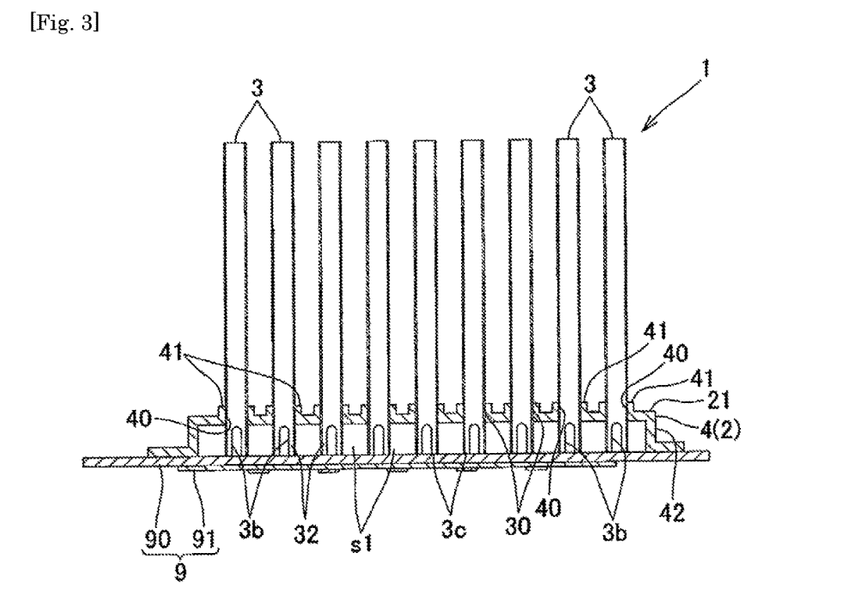
FIG. 3 is a cross-sectional view of the heat sink.

As illustrated in FIG. 1, FIG. 2 and FIG. 3, a heat sink 1 in the embodiment includes a supporting main body 2 made of a material having excellent heat conductivity and one or a plurality of cylindrical body(ies) 3 that is(are) provided on the supporting main body 2 in a standing manner and is(are) made of a material having excellent heat conductivity. The supporting main body 2 is fixed to a cooling target object 9 with a gap s1 ensured therebetween. As the materials of the supporting main body 2 and the cylindrical body 3, which have excellent heat conductivity, metal materials such as aluminum, copper, and iron are preferable, for example.

The cooling target object 9 includes an LED substrate 91 configuring the LED lighting device and a housing plate 90 made of metal to which the LED substrate 91 is attached in this example. The supporting main body 2 is fixed to the surface of the housing plate 90 at the opposite side to the LED substrate 91 and the cylindrical bodies 3 are provided on a surface 21 of the supporting main body 2 at the opposite side to a fixed surface 20 in a standing manner. It is needless to say that the LED substrate 91 as a heat source may be directly fixed to the supporting main body 2.

The supporting main body 2 is configured by a supporting plate 4 onto which the cylindrical bodies 3 can be fixed and caulked by press-working thereof and which is made of metal. Leg portions 42 having substantially L-shaped cross sections are provided on opposing end sides of the supporting plate 4. The supporting plate 4 is fixed onto the surface of the housing plate 90 at the opposite side to the LED substrate 91 with the leg portions 42 in a state of keeping the gap s1 therefrom. As a method for fixing the supporting main body 2 and the cooling target object 9, that is, a method for fixing the leg portions 42 onto the housing plate 90 in this example, various fixing methods such as screwing, pinning, and bonding with an adhesive, soldering, brazing, welding, and the like can be widely applied.

Figure 5:
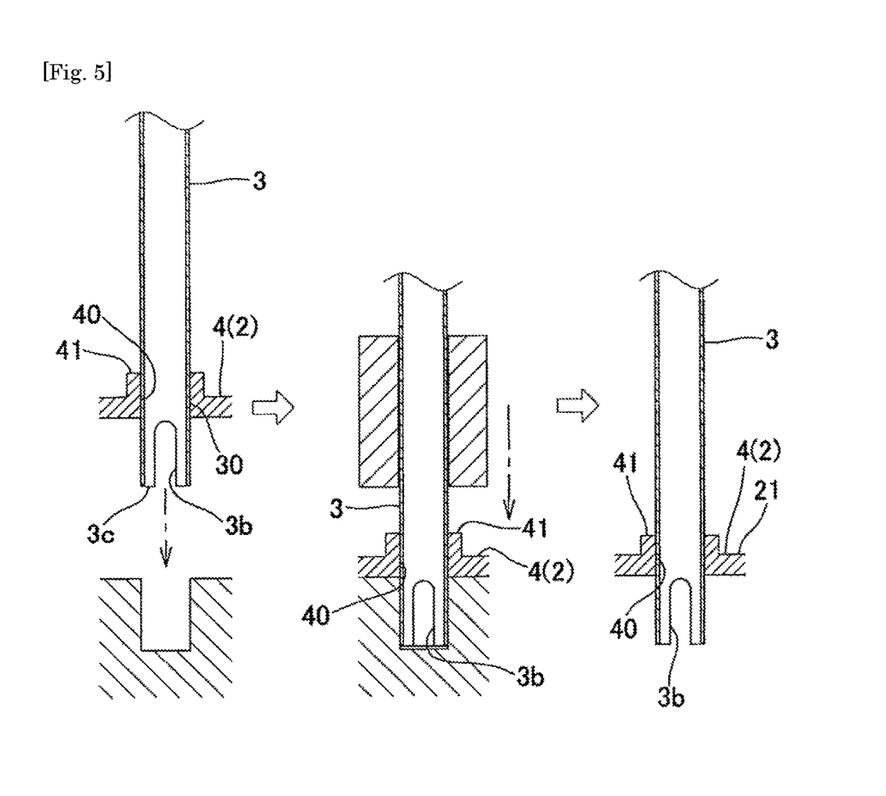
FIG. 5 is a descriptive view for explaining procedures of fixing the cylindrical body to a supporting main body (supporting plate) by caulking.
Figure 6:
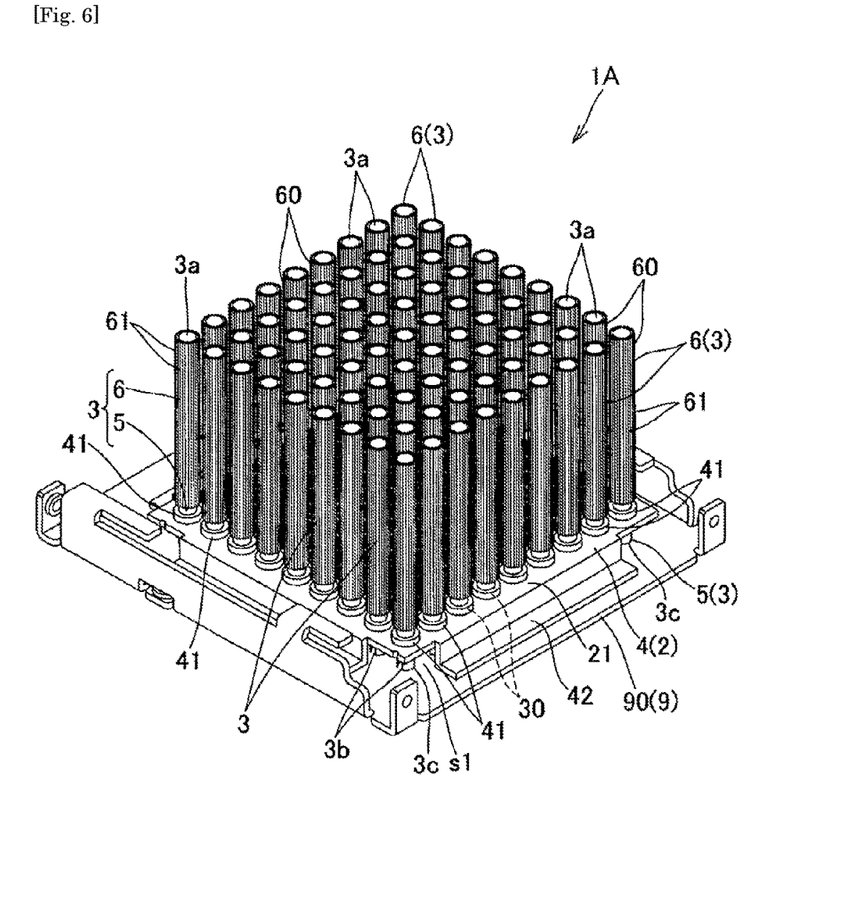
FIG. 6 is a perspective view illustrating a heat sink according to a second embodiment of the invention.

To be more specific, the configuration of the caulking fixing of the cylindrical bodies 3 by the supporting plate 4 is as follows. As illustrated in FIG. 5, each cylindrical body 3 is fixed and caulked by providing an attachment hole 40 through which the cylindrical body 3 is inserted for fixing on the supporting plate 4, forming a thick portion 41 along the inner circumferential edge of the attachment hole 40 by burring working, performing compression press working on the thick portion 41 from the axial direction in a state where the cylindrical body 3 has been inserted into the attachment hole 40, and plastically deforming the thick portion 41 in the direction toward the center of the attachment hole 40 and pressure-bonding the thick portion 41 to the outer circumferential surface of the cylindrical body 3.

With the configuration of the caulking fixing, the contact area of the inner surfaces of the thick portions 41 of the supporting plate 4 with the outer circumferential surfaces of the cylindrical bodies 3 can be increased so as to improve the supporting strength and efficiently transfer heat absorbed by the supporting plate 4 to the side of the cylindrical bodies 3, thereby enhancing an heat dissipation effect. The configuration of the caulking fixing requires the supporting plate 4 to be made of a metal material. However, the cylindrical bodies 3 can be made of a material other than the metal material, for example, resin having high heat conductivity.

Figure 4:
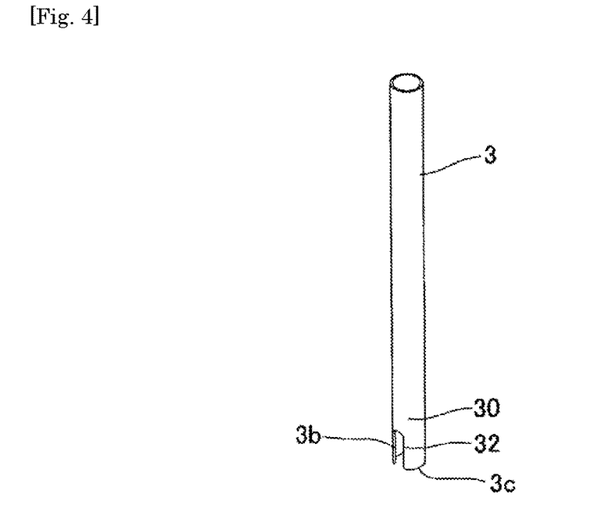
FIG. 4 is a perspective view illustrating a cylindrical body of the heat sink.

Each cylindrical body 3 has an opening 3a of which inner and outer sides are opened on a front end and is provided with a through-hole 3b communicating the inner side and the outer side on a side wall at the base end side. To be more specific, the cylindrical body 3 is made into a state where a portion at the base end side penetrates through the supporting plate 4 and projects into the gap s1, and a base end 3c abuts against the cooling target object. The cylindrical body 3 is provided in the standing manner in a state where a portion at the front end side projects from the surface 21 of the supporting plate 4 at the opposite side to the cooling target object 9.

The through-hole 3b is provided at a position 32 between a caulking fixing portion 30 and the base end 3c, that is, at a position opened to the space in the gap s1. In this example, the through-hole 3b is configured as a cut-out groove opened on the base end 3c as illustrated in FIG. 4.

With the configuration in the embodiment, heat of the cooling target object 9 is directly transferred to the cylindrical bodies 3 abutting against it and is dissipated to the outside through the cylindrical bodies 3 and the supporting plate 4. In addition, heat accumulated in the gap s1 between the supporting plate 4 and the cooling target object 9 (housing plate 90) is taken into the inner spaces of the cylindrical bodies 3 through the through-holes 3b of the cylindrical bodies 3 so as to flow to the front end side as heat flow and be efficiently discharged to the outside through the openings 3a on the front ends. Also in the process thereof, the heat is discharged to the outside through the circumferential walls of the cylindrical bodies 3.

Further, in the embodiment, intermediate portions of the cylindrical bodies 3 are fixed by the supporting plate 4 and the base ends 3c are made to abut against the cooling target object 9. Therefore, the strength for supporting the cylindrical bodies 3 is significantly improved. It is needless to say that the base ends 3c can be also configured to float without being made to abut against the cooling target object 9.

Although the cylindrical bodies 3 have cylindrical shapes in this example, they are not limited to have circular cross-sectional shapes and can have oval cross-sectional shapes, rectangular cross-sectional shapes, polygonal cross-sectional shapes, and other cross-sectional shapes, of course. Further, the cylindrical bodies 3 can be configured by inner and outer double pipes or equal to or more than triple pipes made of different materials.

Next, a second embodiment of the invention will be described with reference to FIG. 6, FIG. 7, FIG. 8(a) and FIG. 8(b).

As illustrated in FIG. 6, FIG. 7, FIG. 8(a) and FIG. 8(b), in a heat sink TA in the embodiment, each cylindrical body 3 is configured by coupling equal to or more than two cylinders including a cylinder 5 at the base end side, which has the through-hole 3b and is fixed to the supporting main body 2, and a cylinder 6 at the front end side, which has the opening 3a on the front end, to each other in the axial direction in a state where inner spaces of the cylinders communicate with each other. With this coupling configuration, the cylinders can have configurations in accordance with respective positions thereof while materials and structures of the cylinders are made different.

Figure 7:
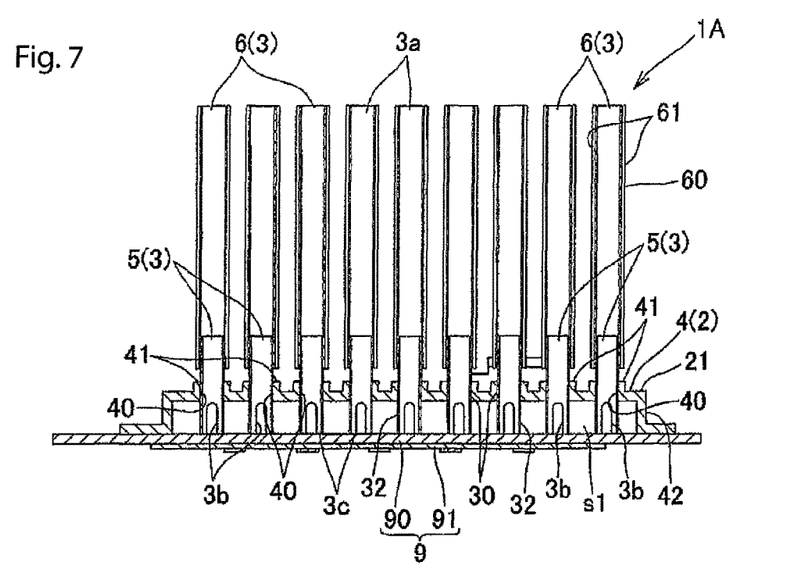
FIG. 7 is a cross-sectional view of the heat sink.

In the embodiment, the outer diameters of the cylinders 5 at the base end side, which are fixed to the supporting main body 2 (supporting plate 4), are set to be smaller than the outer diameters of the cylinders at the front end side so as to prevent lowering in the strength of the supporting main body 2 itself for fixing the cylinders 5 at the base end side (note that the strength lowers when the holes for caulking fixing are large). In addition, for coping with a point that the cylinders 5 at the base end side are reduced in thickness in order to maintain the inner spaces, the material having excellent heat conductivity is selected so as to complement a heat absorbing effect for heat from the supporting main body 2.

In addition, a material having heat conductivity lower than that of the cylinders 5 but reduced in cost is selected for the cylinders 6 at the front end side. With this, the cylinders 6 at the front end side have large dimensions externally fitting with end portions of the cylinders 5 in order to complement the heat conductivity, thereby ensuring the cross-sectional areas thereof. In particular, the cylinders 5 at the base end side, which are made of an expensive material, are set to have the minimum lengths having sites at which they are fixed to the supporting main body 2 (supporting plate 4), sites at which the through-holes 3b are provided, and sites at which the cylinders 6 are coupled thereto and another portions are configured by the cylinders 6 made of a relatively inexpensive material. This enables reduction in cost while enhancing the heat conductivity as described above.

Figure 8A:
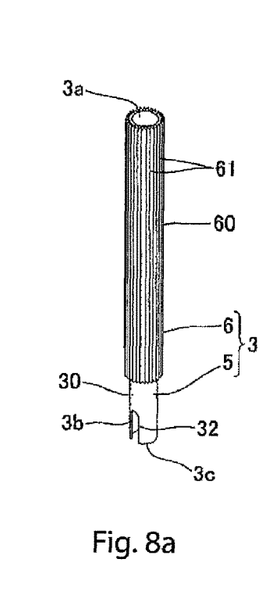
FIG. 8(a) is a perspective view illustrating a cylindrical body of the heat sink and FIG. 8(b) is a longitudinal cross-sectional view illustrating a method for bonding cylinders configuring the cylindrical body to each other.
Figure 8B:
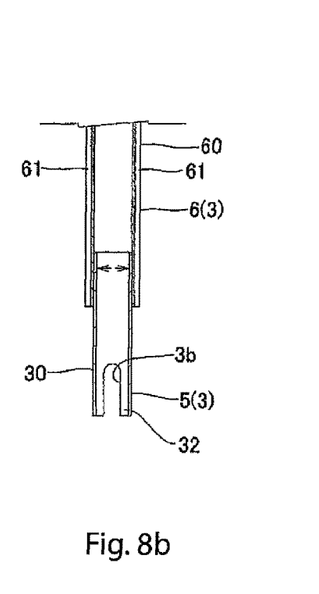

The coupling between the cylinders 5 and the cylinders 6 are made by externally fitting end portions of the cylinders 6 with the end portions of the cylinders 5. The cylinders 5 and the cylinders 6 are made close contact with and fixed to each other by pipe expansions thereof by deforming the end portions of the cylinders 5 as fitted portions so as to enlarge the diameters thereof for caulking coupling, as illustrated in FIG. 8(b). With this, excellent coupling strength and the heat conductivity between them are maintained. The cylinders 5 in this example are made to have cylindrical shapes advantageous for both the caulking fixing with the supporting plate 4 and the pipe expansions thereof to the cylinders 6.

Further, the cylinders 6 at the front end side are configured to have irregular surfaces 60 on which a plurality of protrusions 61 extending along the axial direction are provided on the outer circumferential surfaces at an interval in the circumferential direction in order to increase the surface areas and thereby enhance the heat dissipation performance. This configuration can enhance an effect of dissipating the hot air taken into the inner spaces to the outside through the pipe walls of the cylinders 6 during the circulation of the hot air to the front end side. As a result, the circulation of the hot air in the inner spaces is further accelerated, thereby further enhancing the heat dissipation effect by taking of the hot air accumulated in the gap s1, movement thereof to the front end side, and the release thereof.

The inner circumferential surfaces of the cylinders 6 have no irregularity in order to enhance the heat conductivity by making the inner circumferential surfaces of the cylinders 6 and the outer circumferential surfaces of the cylinders 5 close contact with each other by pipe expansions thereof. However, sites of the inner circumferential surfaces of the cylinders 6 other than the coupling portions or all the sites thereof may be formed by irregular surfaces so as to efficiently absorb the hot air taken into the inner spaces through the inner circumferential surfaces of the cylinders 6 in the process of circulating the hot air to the front end side and dissipate heat to the outside through the outer circumferential surfaces thereof.

Although the cylinders 5 and 6 basically have cylindrical shapes in this example, they are not limited to have the circular cross-sectional shapes and can have oval sectional shapes, rectangular sectional shapes, polygonal sectional shapes, and other sectional shapes, of course. Further, the cylinders 5 and 6 can be configured by inner and outer double pipes or equal to or more than triple pipes made of different materials.

As procedures of the caulking fixing of the cylinders 5 to the supporting main body 2 (supporting plate 4) and the pipe expansions thereof between the cylinders 5 and 6, it does not matter which of the caulking fixing and the pipe expansions thereof is performed first. The cylinders 5 can be fixed to the supporting plate 4 by caulking first, and then, the cylinders 6 can be fixed thereto by the pipe expansions thereof. Alternatively, the cylinders 5 to which the cylinders 6 have been already coupled by the pipe expansions thereof can be fixed to the supporting plate 4 by caulking.

Although the two cylinders 5 and 6 are coupled to each other in this example, it is needless to say that equal to or more than three cylinders may be coupled with equal to or more than one cylinder(s) interposed between the cylinders 5 and 6. Other configurations, variations, and the like are basically the same as those in the above-described first embodiment. The same reference numerals denote the same components and description thereof is omitted.

Next, a third embodiment of the invention will be described with reference to FIG. 9, FIG. 10, FIG. 11, FIG. 12(a), FIG. 12(b) and FIG. 13.

Figure 9:
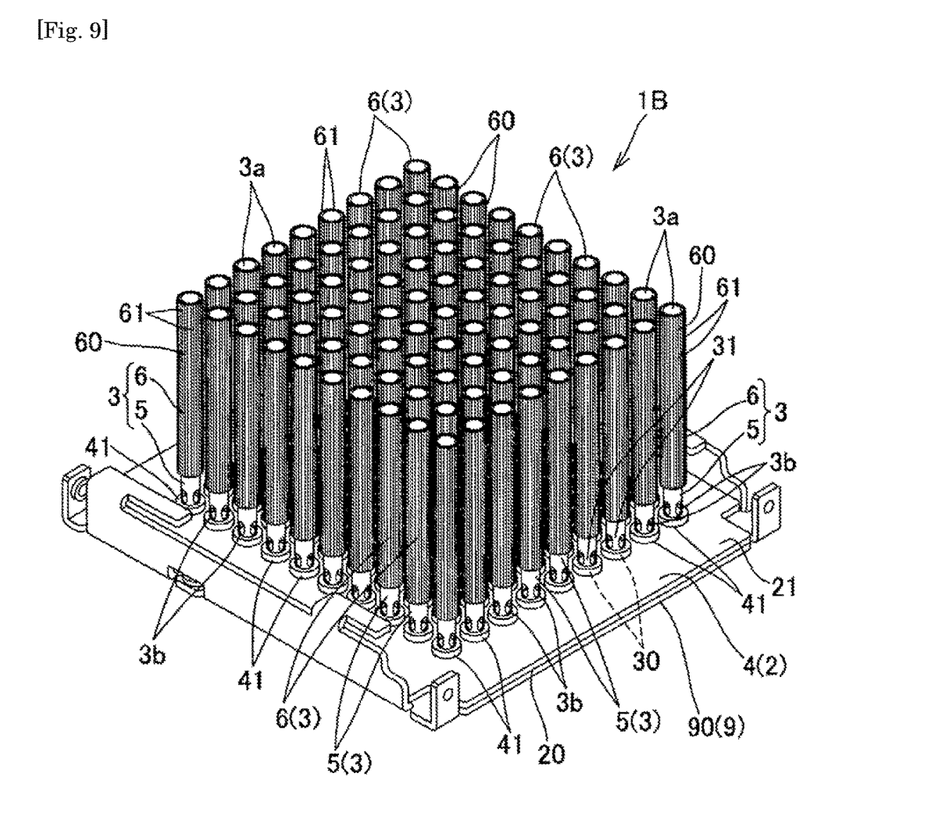
FIG. 9 is a perspective view illustrating a heat sink according to a third embodiment of the invention.
Figure 10:
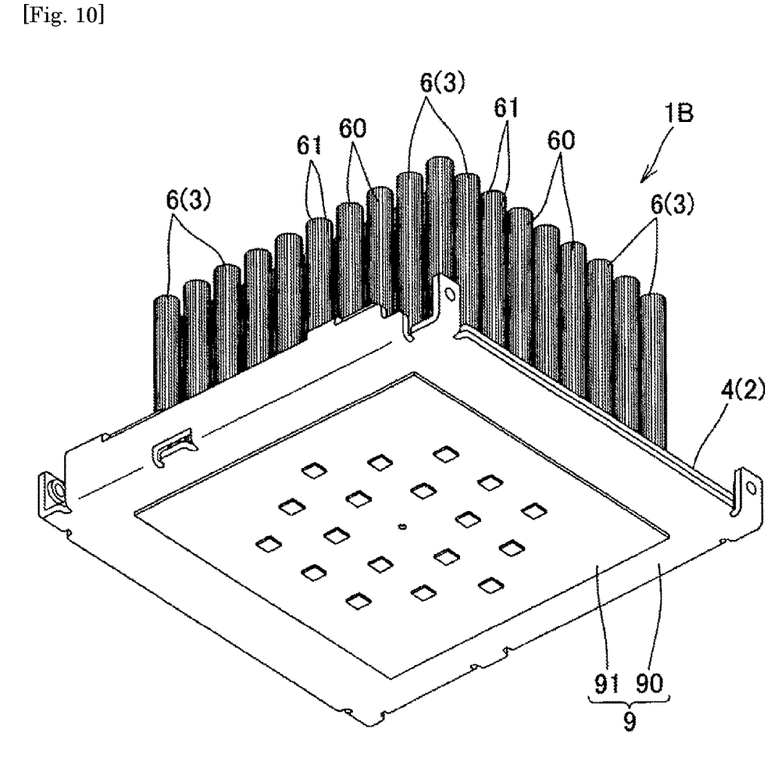
FIG. 10 is a perspective view illustrating the heat sink when seen from a cooling target object side.
Figure 11:
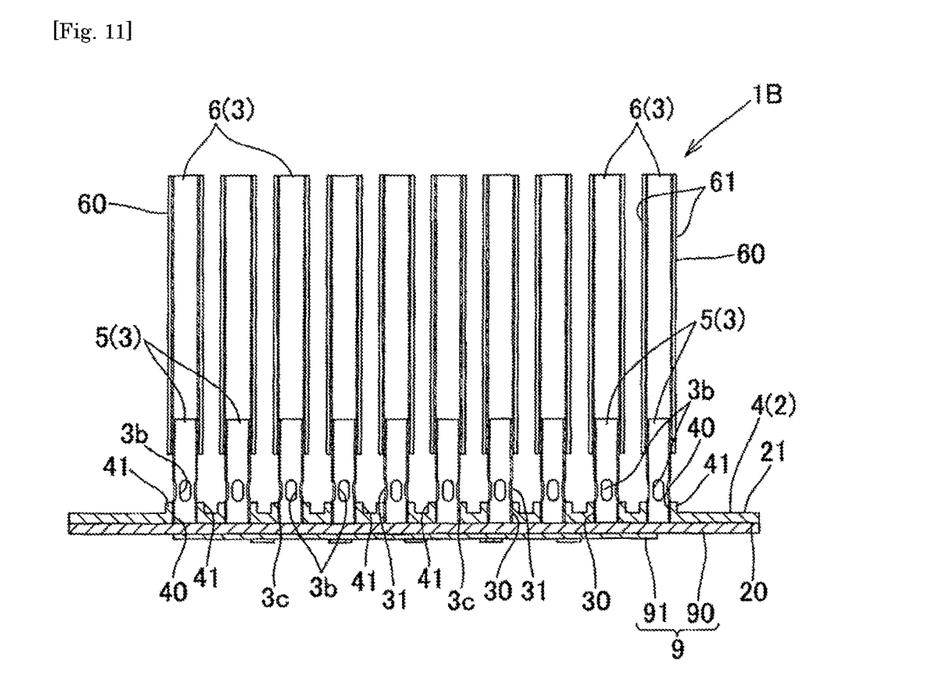
FIG. 11 is a cross-sectional view of the heat sink.
Figure 12A:
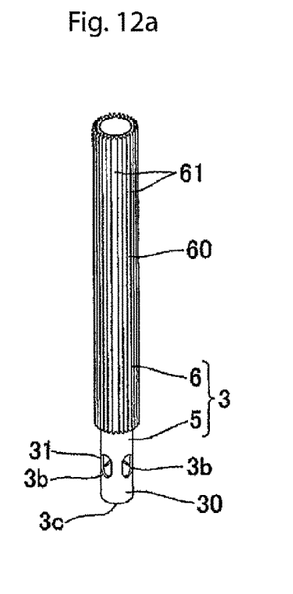
FIG. 12(a) is a perspective view illustrating a cylindrical body of the heat sink and FIG. 12(b) is a longitudinal cross-sectional view illustrating a method for bonding cylinders configuring the cylindrical body to each other.
Figure 12B:
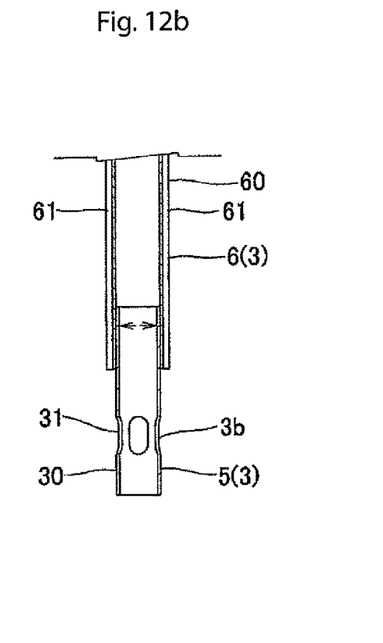

As illustrated in FIG. 9, FIG. 10 and FIG. 11, in a heat sink 1B in the embodiment, the supporting main body 2 is fixed to the cooling target object 9 in a close contact state with no gap therebetween. To be specific, the surface of the supporting plate 4 as the supporting main body 2 to which the cylindrical bodies 3 are fixed at the opposite side to the surface thereof on which the cylindrical bodies 3 are provided in the standing manner is fixed to the housing plate 90 as the cooling target object 9 in a surface contact state. With this, heat transferred from the LED substrate 91 to the housing plate 90 efficiently moves to the supporting plate 4 so as to be efficiently dissipated through the surface of the supporting plate 4 and the cylindrical bodies 3 as will be described later.

In the same manner as in the second embodiment, each the cylindrical body 3 is configured by coupling at least equal to or more than two cylinders including the cylinder 5 at the base end side, which has the through-hole 3b and is fixed to the supporting main body 2 (supporting plate 4), and the cylinder 6 at the front end side, which has the opening 3a on the front end, to each other in the axial direction in a state where the inner spaces of the cylinders communicate with each other.

In the embodiment, the cylinders 5 are fixed into the supporting plate 4 by caulking while the base ends 3c thereof do not project from one surface (the fixed surface 20 as the surface at the side fixed to the cooling target object 9) of the supporting plate 4, but project only to the other surface 21 side of the supporting plate 4. The heat absorbed by the supporting plate 4 from the housing plate 90 is dissipated into the air through the other surface 21 and is transferred to the cylinders 5 so as to be dissipated into the air through the cylindrical bodies 3 including the cylinders 6.

Figure 13:
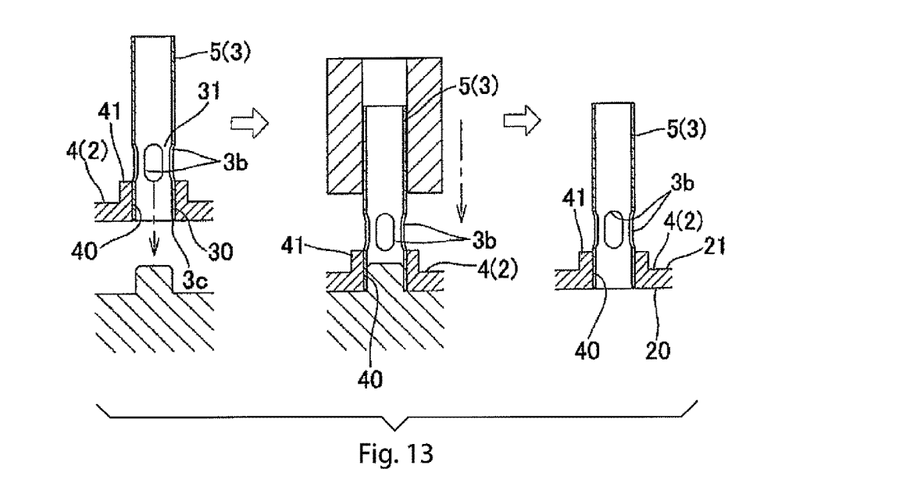
FIG. 13 is a descriptive view for explaining procedures of fixing the cylindrical body to a supporting main body (supporting plate) by caulking.

To be more specific, the configuration of the caulking fixing of the cylinders 5 by the supporting plate 4 is as follows. As illustrated in FIG. 13, each cylinder 5 is fixed by caulking by providing the attachment hole 40 through which the cylinder 5 is inserted for fixing on the supporting plate 4, forming the thick portion 41 along the inner circumferential edge of the attachment hole 40 by burring working, performing compression press working on the thick portion 41 from the axial direction in a state where the cylinder 5 has been inserted into the attachment hole 40, and plastically deforming the thick portion 41 in the direction toward the center of the attachment hole 40 and pressure-bonding the thick portion 41 onto the outer circumferential surface of the cylindrical body 3.

With the configuration of the caulking fixing, the contact area of the inner surfaces of the thick portions 41 of the supporting plate 4 with the outer circumferential surfaces of the cylinders 5 can be increased so as to improve the supporting strength and efficiently transfer the heat absorbed by the supporting plate 4 to the side of the cylinders 5, thereby enhancing the heat dissipation effect. The configuration of the caulking fixing requires the supporting plate 4 to be made of a metal material. However, the cylinders 5 can be made of a material other than the metal material, for example, resin having high heat conductivity.

Further, the air in the vicinity of the other surface 21 of the supporting plate 4, that is, the air in the vicinity of the bases of the cylinders 5 is increased in temperature with the dissipated heat. The hot air is taken into the cylinders 5 through the through-holes 3b thereof as will be described later and is released through the openings 3a on the front ends of the cylinders 6. That is to say, the cylindrical bodies 3 dissipate heat from the surfaces at the front end side and take the heat in the vicinity of the bases thereinto and discharge the heat to the outside through the openings on the front ends. Thus, the cylindrical bodies 3 have configurations for significantly enhancing the heat dissipation effect.

The through-holes 3b are provided so as to open at positions 31 adjacent to the caulking fixing portions 30 on base end portions of the cylinders 5 at the surface 21 side of the supporting plate. With this, the hot air in the vicinity of the surface 21 of the supporting plate 4 is efficiently taken into the inner spaces through the through-holes 3b so as to move as heat flow to the front end side, which is generated by heat deviation in the inner spaces. Then, the heat is released to the outside through the openings 3a while being discharged to the outside through the inner walls of the cylindrical bodies 3 (cylinders 5 and 6) in the process thereof.

Accordingly, the heat dissipation effect is enhanced by causing the cylindrical bodies 3 to be crowded. In addition, the hot air that tends to be accumulated in the vicinity of the surface of the supporting member at the base end side due to the crowded cylindrical bodies 3 can be efficiently discharged to the front end side through the inner spaces of the cylindrical bodies 3 even without providing a forcible air blower such as a fan. Therefore, the heat sink excellent in the heat dissipation effect can be provided at reduced cost.

Other configurations, variations, and the like are basically the same as those in the first embodiment. In particular, the configurations and the variations of the cylindrical bodies 3 are basically the same as those in the second embodiment. The same reference numerals denote the same components and description thereof is omitted.

Although the embodiments of the invention have been described above, the invention is not limited to the embodiments. It is needless to say that the invention can be executed in various forms in a range without departing from the scope of the invention, such as a form in which the forcible air blower such as the fan is further incorporated.

REFERENCE SIGNS LIST 1, 1A, and 1B Heat sink
2 Supporting main body
3 Cylindrical body
3a Opening
3b Through-hole
3c Base end
4 Supporting plate
5 and 6 Cylinder
9 Cooling target object
20 and 21 Surface
30 Fixing portion
31 and 32 Position
40 Attachment hole
41 Thick portion
42 Leg portion
60 Irregular surface
61 Protrusion
90 Housing plate
91 Substrate
s1 Gap

The invention claimed is:

1. A heat sink, comprising:
   a supporting main body to which a cooling target object is fixed and that is made of a material having heat conductivity, and
   at least one cylindrical body that is provided on the supporting main body in a standing manner and is made of a material having heat conductivity,
   wherein:
   the at least one cylindrical body has an opening passing through a front end thereof and is provided with a through-hole communicating an inner side and an outer side on a side wall at a base end side,
   the at least one cylindrical body is configured by coupling at least two cylinders including a cylinder at the base end side, which has the through-hole and is fixed to the supporting main body, and a cylinder at the front end side, which has the opening, to each other in an axial direction in a state where inner spaces of the cylinders communicate with each other, and
   an atmosphere containing heat emitted from the supporting main body is capable of being made to flow into the at least one cylindrical body through the through-hole, circulate in an inner space of the cylindrical body, and be released to outside through the opening on the front end.

2. The heat sink according to claim 1, wherein an outer diameter of the cylinder at the base end side is smaller than an outer diameter of the cylinder at the front end side and the cylinder at the base end side is made of a material having higher heat conductivity than a material of the cylinder at the front end side.

3. The heat sink according to claim 1, wherein a plurality of protrusions extending along the axial direction are provided on an outer circumferential surface of the cylinder at the front end side at an interval in a circumferential direction.

4. The heat sink according to claim 1, wherein the cylinders are coupled by fixing and caulking end portions of the cylinders to each other by pipe expansions thereof.

5. The heat sink according to claim 1, wherein the supporting main body is comprised of a supporting plate to which the cylindrical body is fixed and caulked by press-working thereof.

6. The heat sink according to claim 5, which is configured by providing an attachment hole through which the cylindrical body is inserted on the supporting plate for fixing, forming a thick portion along an inner circumferential edge of the attachment hole by burring working, performing compression press working on the thick portion from the axial direction in a state where the cylindrical body has been inserted into the attachment hole, and plastically deforming the thick portion in a direction toward a center of the attachment hole and pressure-bonding the thick portion to an outer circumferential surface of the cylindrical body for caulking fixing.

* * * * *